United States Patent [19]
Schweers et al.

[11] Patent Number: 6,166,920
[45] Date of Patent: Dec. 26, 2000

[54] DUAL PROCESSOR ASSEMBLY RETENTION MEMBER

[75] Inventors: Michael R. Schweers, Hillsboro; James D. Williams, Portland, both of Oreg.

[73] Assignee: Intel Corporation, Santa Clara, Calif.

[21] Appl. No.: 09/133,601

[22] Filed: Aug. 13, 1998

[51] Int. Cl.[7] .................................................. H05R 7/14
[52] U.S. Cl. ........................ 361/801; 361/756; 361/759; 361/802; 439/564
[58] Field of Search ................................... 361/724–726, 361/735–737, 745, 754, 756, 759, 800–802, 825; 439/573, 572, 564, 565

[56] References Cited

U.S. PATENT DOCUMENTS

| | | | |
|---|---|---|---|
| 3,775,643 | 11/1973 | Schachnow et al. | 317/101 |
| 3,829,741 | 8/1974 | Athey | 317/101 |
| 3,932,016 | 1/1976 | Ammenheuser | 339/65 |
| 5,187,648 | 2/1993 | Ito | 361/818 |
| 5,650,917 | 7/1997 | Hsu | 361/759 |
| 5,781,414 | 7/1998 | Mills et al. | 361/786 |
| 5,883,792 | 3/1999 | Summers et al. | 361/825 |
| 6,038,131 | 3/2000 | Valosen et al. | 361/756 |

*Primary Examiner*—Jeffrey Gaffin
*Assistant Examiner*—Tuan Dinh
*Attorney, Agent, or Firm*—Kenyon & Kenyon

[57] ABSTRACT

A retention member for securing a dual processor card retention module to a circuit board is provided. In accordance with an embodiment of the present invention, the retention member includes a base portion. A first securement portion is disposed at a first end of the base portion and defines a first bore that extends therethrough. A second securement portion is disposed at a second end of the base portion and defines a second bore that extends therethrough.

15 Claims, 5 Drawing Sheets

DUAL PROCESSOR ASSEMBLY RETENTION MEMBER

BACKGROUND OF THE INVENTION

The present invention relates to an apparatus and method for mounting a dual processor card assembly to a circuit board. More specifically, the invention provides for retaining a dual processor assembly on a circuit board without requiring that the board be provided with mounting hardware on it.

Currently, methods are known for mounting a dual processor assembly within a personal computer, however, there are drawbacks with the known methods. A first known method for mounting the processor assembly involves mounting the assembly by utilizing the computer's chassis as the mounting structure. Whereas this method may provide for adequate support for the assembly, the computer chassis is specifically configured to accommodate the processor assembly. This presents particular problems if the processor assembly is produced by one manufacturer and the computer chassis is produced by a second manufacturer. If the computer chassis manufacturer does not have prior knowledge of the mounting requirements of the processor assembly before manufacturing the chassis, the chassis is not able to accommodate the processor assembly. Thus, the processor assembly is not able to be utilized in all of the various computer chassis that are currently in existence. If an individual wants to upgrade his/her personal computer by incorporating the dual processor assembly, it may not be possible because the individual's computer chassis may not be configured to structurally support the assembly.

A second known method for mounting the processor assembly has alleviated some of the problems of the method addressed above, but deficiencies still exist. The second known method mounts the processor assembly directly to the printed circuit board (the "motherboard"). Thus, the processor assembly can be mounted to the board and the board can be installed in the user's computer. This method has solved the problem that the computer chassis be specifically configured to support the assembly, however, with the second currently known method the circuit board is specifically provided with mounting structure that is utilized in combination with mounting hardware to mount the assembly. The board manufacturer's process for manufacturing motherboards are thus modified when the process is used to produce a board that is specifically configured to accommodate the dual processor assembly. This results in additional time and costs for manufacturing the boards.

Therefore it would be desirable to provide for an improved apparatus and method for mounting the processor assembly.

SUMMARY OF THE INVENTION

In accordance with an embodiment of the present invention, a retention member for securing a dual processor card retention module to a circuit board is provided. The retention member includes a base portion. A first securement portion is disposed at a first end of the base portion and defines a first bore that extends therethrough. A second securement portion is disposed at a second end of the base portion and defines a second bore that extends therethrough.

DETAILED DESCRIPTION

Figure 1:
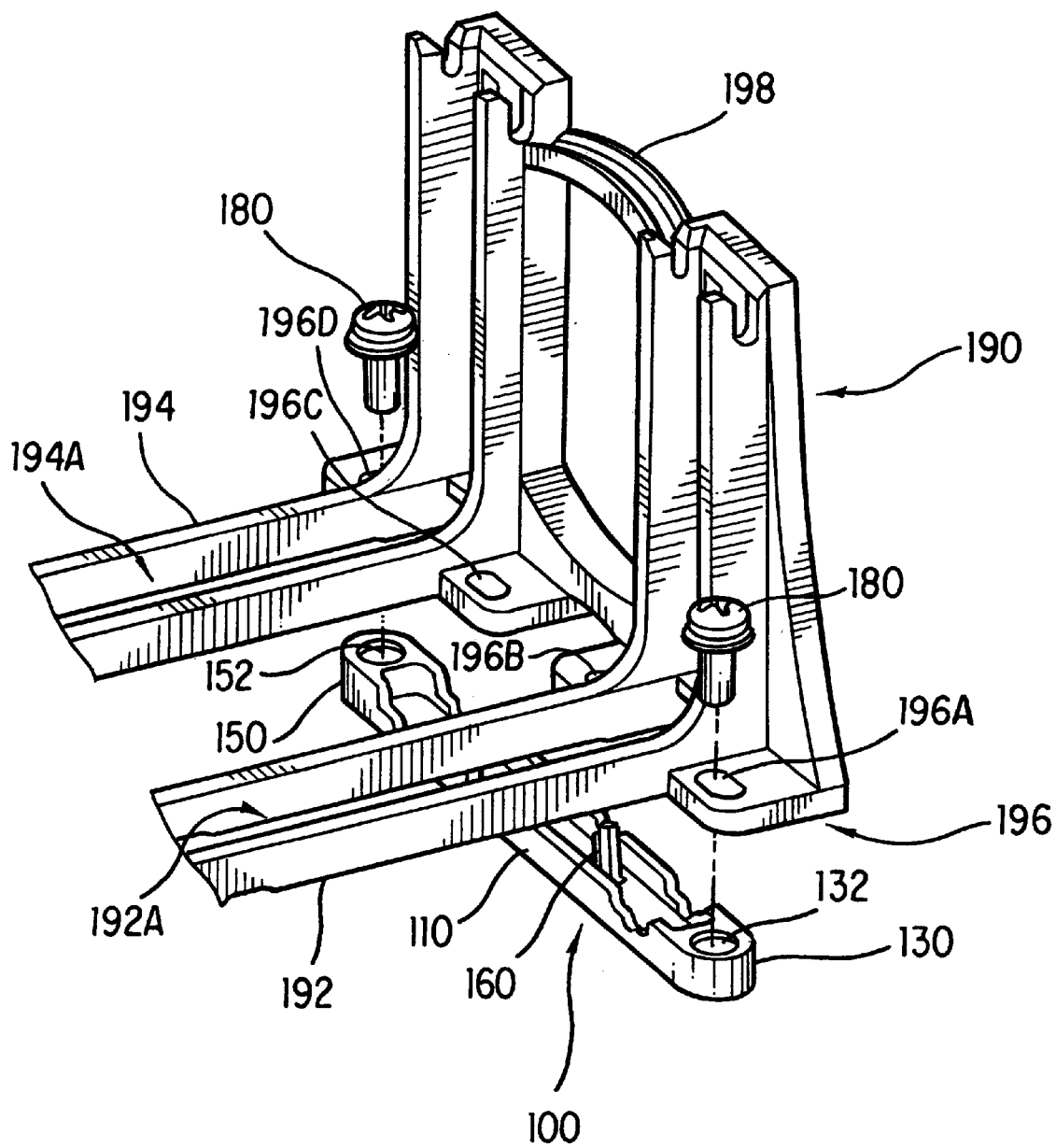
FIG. 1 is a perspective view of an embodiment of the retention member of the present invention as illustrated in spacial relationship with a dual processor card retention module.
Figure 2:
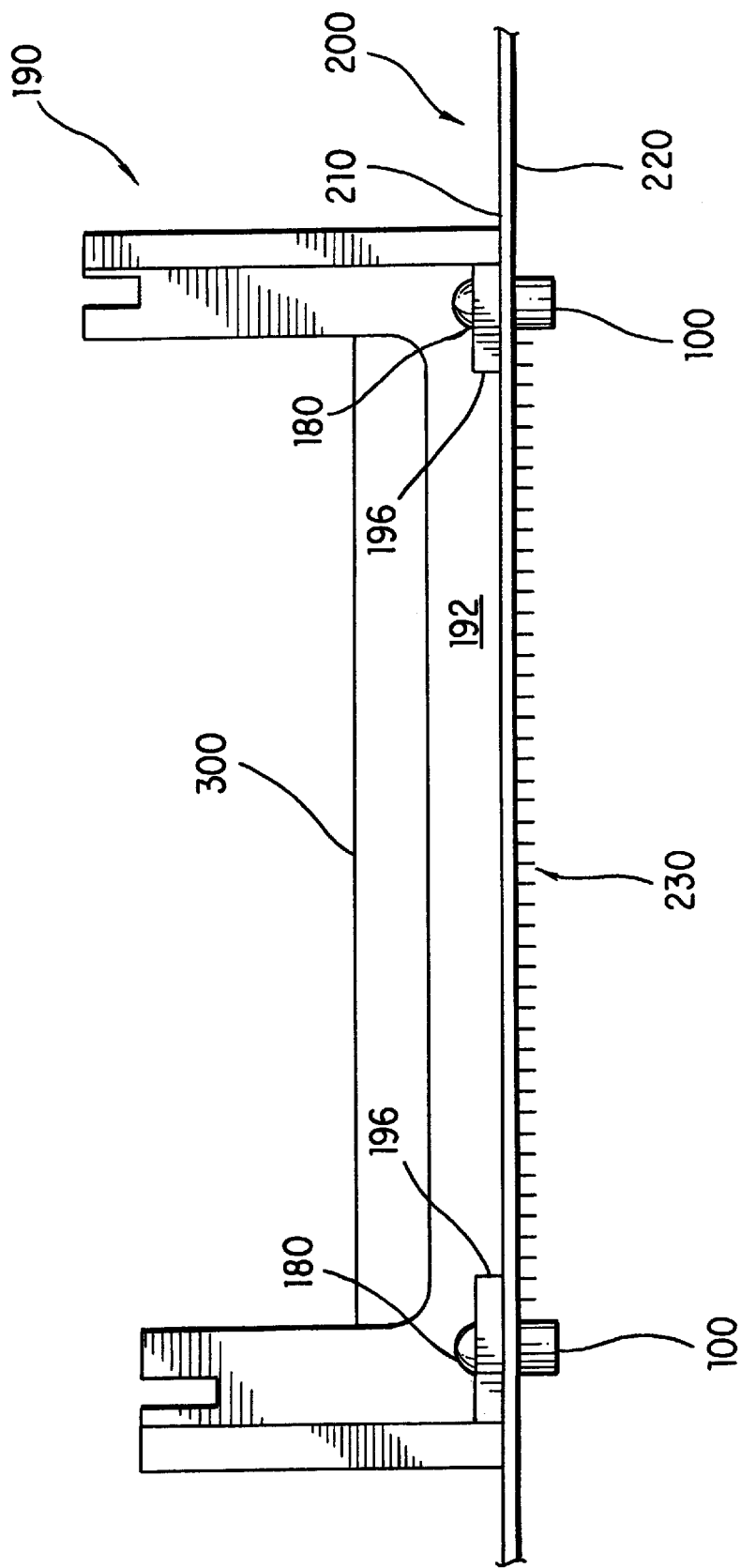
FIG. 2 is a side view of the processor card retention module as it would appear when it is mounted to a motherboard by utilizing the retention member of FIG. 1.
Figure 3:
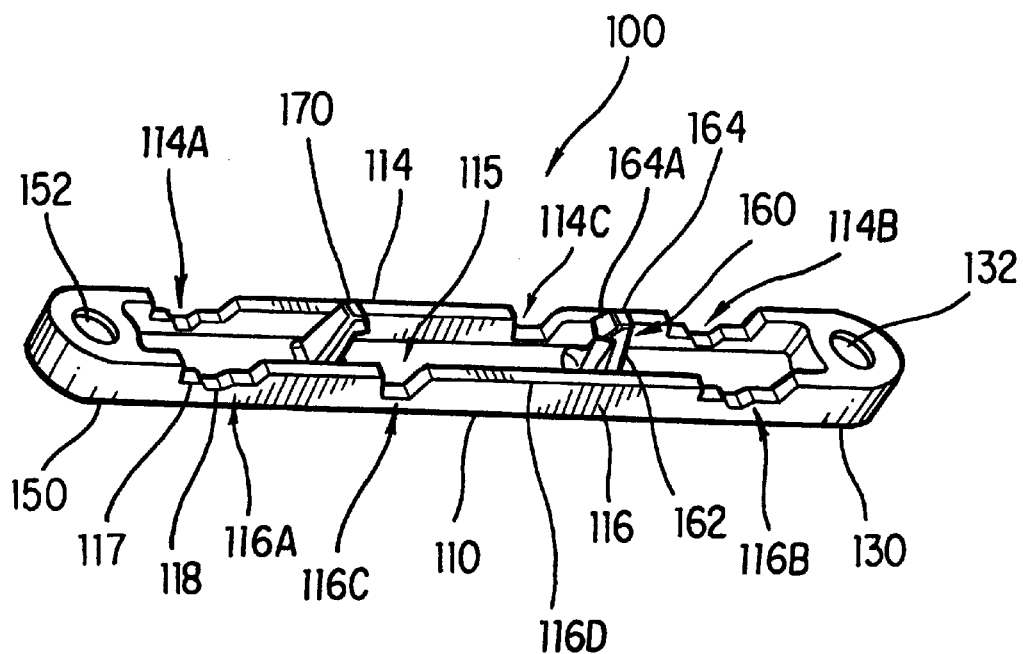
FIG. 3 is a top perspective view of the retention member of FIG. 1.
Figure 4:
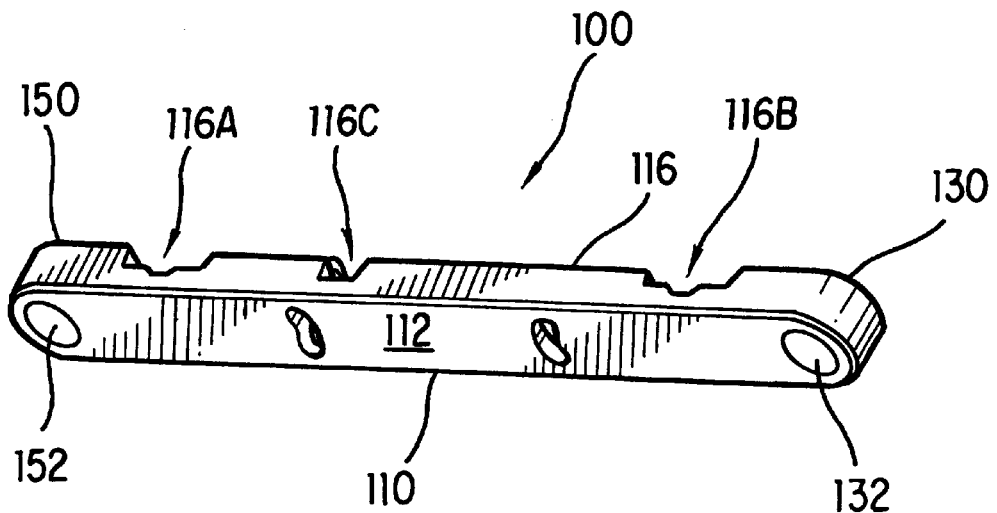
FIG. 4 is a bottom perspective view of the retention member of FIG. 1.

FIG. 1 illustrates an embodiment for the retention member 100 of the present invention. As will be further explained, retention member 100 is utilized to secure a dual processor card retention module 190 onto a printed circuit board 200, or "motherboard", (not shown in FIG. 1). FIG. 2 is a side view of the processor card retention module 190 as it would appear when it is mounted to the motherboard 200 by utilizing two retention members 100.

The dual processor card retention module 190 is utilized to mount a dual processor card assembly to the motherboard 200. The dual processor retention module 190 is positioned on a first side 210, or processor side, of the motherboard 200 and the retention members 100 are positioned on a second side 220, or underside, of the motherboard. Thus, the motherboard 200 is positioned between the retention module 190 and the retention members 100. Connection hardware 180 is utilized to connect the retention module 190 to the retention members 100. The connection hardware may be standard 6-32 screws. The screws pass through apertures 196A, 196D in retention module 190, as shown in FIG. 1, and through apertures in the motherboard 200 and are securely received within the retention members 100. Thus, the retention module 190 is securely mounted to the motherboard 200 through connection with the retention members 100.

Dual processor card retention module 190 is a known component and thus, only a brief description of the dual processor card retention module 190 will be provided. As can be seen in FIGS. 1 and 2, the dual processor card retention module 190 includes a first retention mounting structure 192 and a second retention mounting structure 194. Each retention mounting structure defines a channel, e.g., channel 192A in mounting structure 192 and channel 194A in mounting structure 194. The base of each retention mounting structure is positioned on the motherboard such that an edge connector is received within the channel that is defined by the mounting structure. FIG. 2 shows edge connector 300 as it would be received within channel 192A of mounting structure 192. A processor card connects to each edge connector and is physically supported by the retention mounting structure. First and second retention mounting structures 192, 194 are joined together through connecting member 198. Dual processor card retention module 190 also includes a support base 196 which defines four apertures, namely apertures 196A, 196B, 196C, and 196D. In this embodiment, dual processor card retention module 190 comprises two identically formed halves, only one of which is illustrated in FIG. 1.

Retention member 100 will now be described in further detail. As can be seen in FIGS. 1-9, retention member 100, in accordance with an embodiment of the present invention, is an elongated structure and comprises a base portion 110, a first securement portion 130 and a second securement portion 150. Base portion 110 is formed by a bottom plate 112 and two side edge plates 114 and 116. Bottom plate 112 is an elongated flat structure and first side edge plate 114 and second side edge plate 116 extend upwardly from bottom plate 112 and define a cavity 115 therebetween.

In the side edge plates there are formed recesses. As can be seen, first side edge plate 114 contains first recess 114A and second recess 114B. Additionally, a third recess 114C is provided. Likewise, second side edge plate 116 contains first recess 116A, second recess 116B and third recess 116C. Since the side edge plates are similarly formed in this embodiment, a description will only be provided for side edge plate 116. First recess 116A and second recess 116B are located at opposed sides of side edge plate 116 and comprise a first step portion 117 and a second step portion 118. First step portion 117 extends a first distance below the top edge 116D of second side edge plate 116 and second step portion 118 extends a second distance from top 116D of second side edge plate 116 with the first distance being less than the second distance. First recess 114A on first side edge plate 114 and first recess 116A on second side edge plate 116, as are second recesses 114B and 116B, are opposed from each other and axially aligned on base portion 110. Third recess 116C is not formed of two steps, but rather, is formed with a uniform depth.

The recesses in the side edge plates receive within them hardware that may be included on the underside of the motherboard when Te retention member is mounted on the underside of the motherboard. The recesses allow the retention member to be positioned on the underside of the motherboard without structurally contacting, and thus possibly damaging, the hardware that may be present on the underside of the board. For example, the underside of the printed circuit board on which retention member 100 is mounted is likely to include pin connections, or soldering associated with the pins, to be accommodated when positioning retention member 100 on the printed circuit board.

FIG. 2 illustrates pin connections 230 that may be associated with motherboard 200. It would not be desirable to have the retention member contact these pins because damage could result to the pins. Therefore, the recesses are provided on retention member 100 such that, as the retention member is positioned in contact with the underside of the printed circuit board, circuit hardware on the underside of the board would be positioned within the recesses. Since the dual processor card retention module 190 is used to mount a dual processor card assembly onto the motherboard, it is likely that the underside of the motherboard will contain structure associated with the cards. Therefore, it is likely that the two dual-stepped recesses in the side edge plates of the retention member will accommodate the hardware on the underside of the motherboard that is associated with each processor card. Whereas it was described previously that a third recess could be provided in each side edge plate, this third recess would accommodate additional hardware, if any, on the underside of the motherboard and thus may not be required. Other embodiments may omit a third recess.

As mentioned previously, retention member 100 includes a first securement portion 130 and a second securement portion 150. The securement portions define a bore therein. As such, first securement portion 130 defines first bore 132 and second securement portion 150 defines second bore 152. As discussed previously, the bores receive mounting hardware that is utilized to secure the dual processor card retention module 190 onto the printed circuit board in this embodiment. The securement portions may be either integrally formed with base portion 110 or may comprise a separate element that is attached or connected to base portion 110. In either case, first and second securement portions 130, 150, respectively, provide for receiving hardware that may be utilized to secure the dual processor card retention module 190 onto the motherboard.

Figure 8:
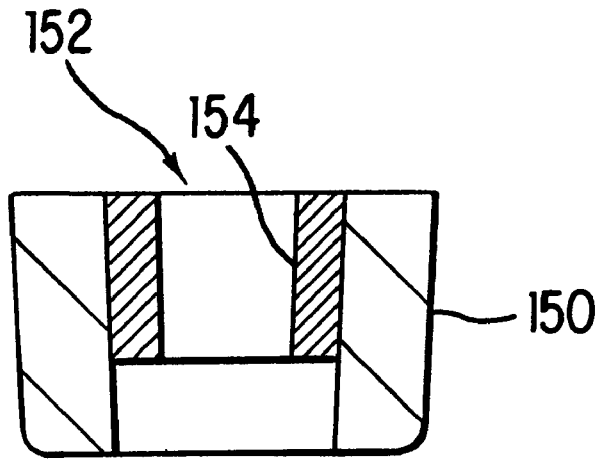
FIG. 8 is a cross-sectional view of the retention member as taken along line 8—8 of FIG. 5.
Figure 9:
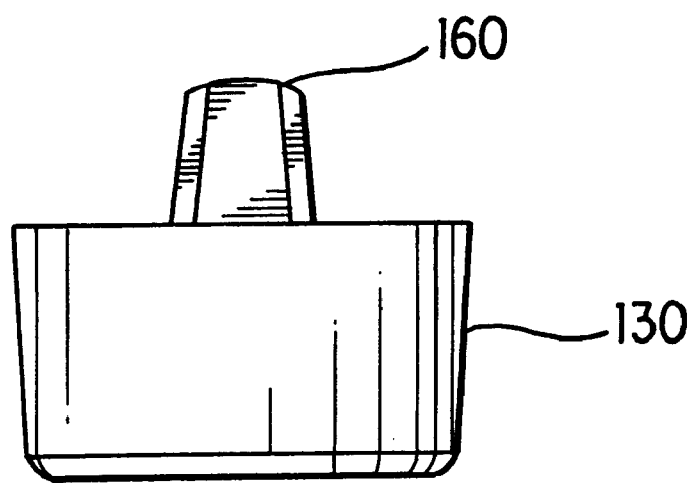
FIG. 9 is a side view of the retention member of FIG. 1.

As can be seen in FIG. 8, the securement portions are internally threaded. FIG. 8 illustrates second securement portion 150 and the second bore 152 that is defined therein. As can be seen, second bore 152 includes a threaded insert 154. Threaded insert 154 extends within bore 152 a portion of the depth of bore 152. Threaded insert 154 may be either integrally molded with the securement portion when it is formed or, alternatively, it may be secured within the securement portion by, for example, utilizing an adhesive, ultrasonic welding, or by press-fitting the threaded insert into the bore. The insert may be made from a variety of materials, including brass or stainless steel. Inserts manufactured by VMP, Inc. (part no. BSP-632-K-2) or PEM, Inc. (part no. STKB-632-4) may be utilized in the present invention.

Figure 5:
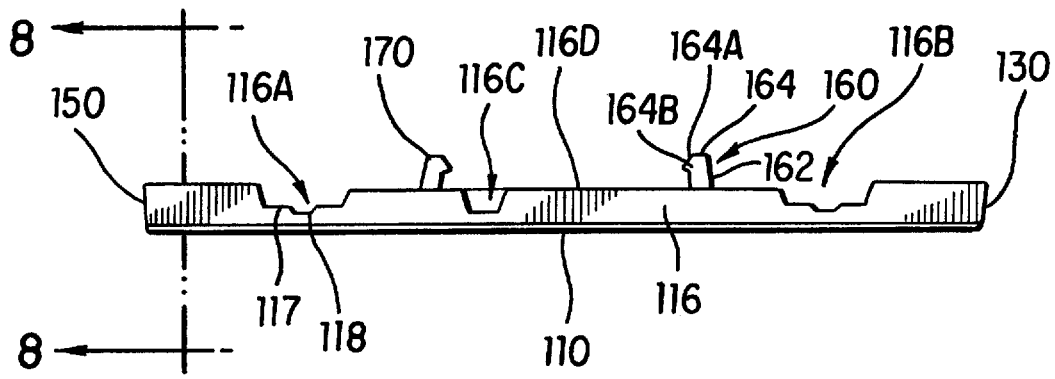
FIG. 5 is a side view of the retention member of FIG. 1.
Figure 6:
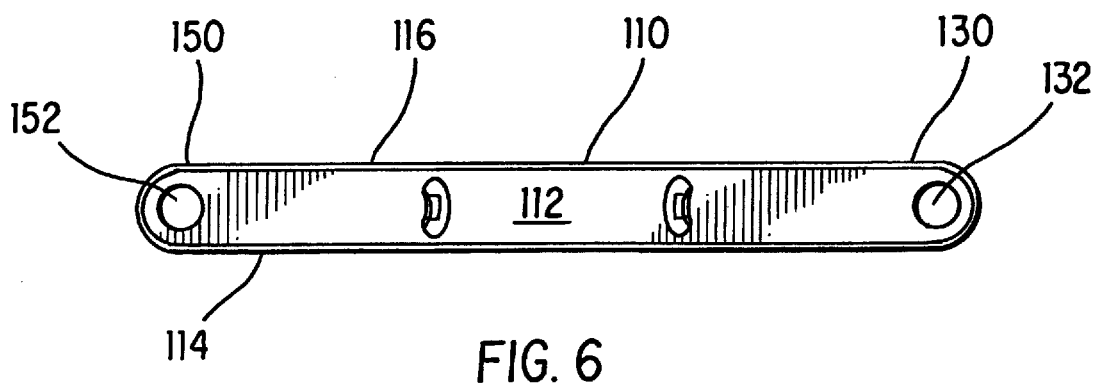
FIG. 6 is a bottom view of the retention member of FIG. 1.
Figure 7:
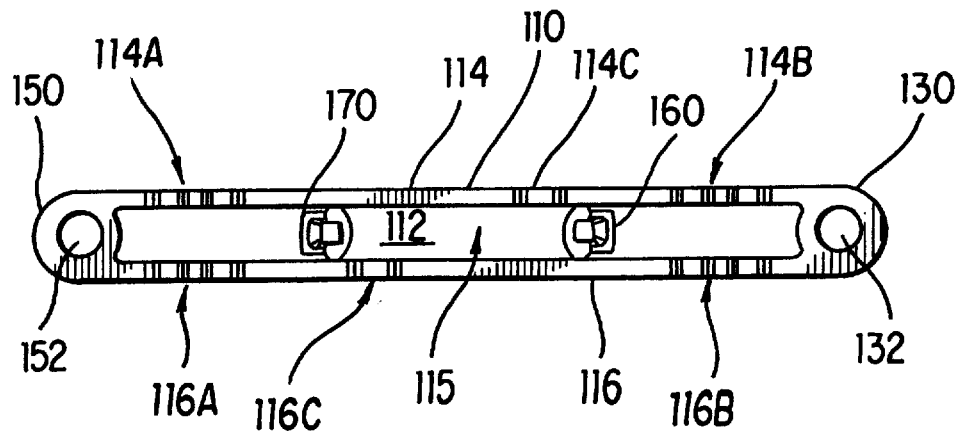
FIG. 7 is a top view of the retention member of FIG. 1.

Retention member 100 also includes first and second attachment members 160 and 170, respectively. Each attachment member is similarly formed and extends vertically from base portion 110 within cavity 115. Since both attachment members are similarly formed, a detailed description will only be provided for first attachment member 160. First attachment member 160 comprises an elongated stem portion 162 and a head portion 164. As mentioned previously, elongated stem portion 162 extends vertically from base portion 110 and extends above the top of each side edge plate. As such, head portion 164 extends above the horizontal plane defined by the tops of the side edge plates. This can be seen clearly as illustrated in FIG. 5. The attachment members, in this embodiment, secure the retention member 100 onto the underside of the printed circuit board, as will be explained.

In securing the retention member 100 to the printed circuit board, when the retention member is aligned on the circuit board, the attachment members align with apertures that are included in the circuit board. As the retention member is positioned in proximity to the circuit board, the camming surface 164A on head 164 of attachment member 160 would engage an edge of the surface that defines the aperture in the printed circuit board. As the retention member 100 is moved into closer proximity with the printed circuit board, the interaction between the printed circuit board and the camming surface 164A flexes the attachment member 160 slightly such that the attachment member is able to extend completely up through the aperture in the printed circuit board. As the attachment member is pushed further through the aperture, the camming surface 164A would no longer contact the printed circuit board and thus the attachment member 160 would deflect back to its original position with respect to base portion 110 such that edge 164B of attachment member 160 now grasps the opposing side of the printed circuit board, i.e., the processor side of the motherboard. Thus, the retention member 100 is now securely mounted onto the printed circuit board. As discussed previously, since the second attachment member 170 is configured similarly to first attachment member 160, attachment member 170 would operate in a similar manner as was described for attachment member 160 in order to secure retention member 100 onto the printed circuit board.

Attachment members 160 and 170 may be either integrally formed with base portion 110 or may be separate elements that are connected to base portion 110. FIGS. 3–7 illustrate attachment members 160, 170 integrally formed with base portion 110.

Attachment members 160 and 170 may also be utilized to align the retention module 190 with respect to the retention member 100. Since attachment members 160 and 170 extend up through the motherboard when the retention member 100 is attached to the motherboard, each aperture 196B and 196C of retention module 190 can be aligned with one of attachment members 160 and 170 of retention member 100 to assist in positioning the retention module 190 with respect to the retention member 100.

Retention member 100 may be manufactured from a variety of materials. An example of a material that could be utilized when manufacturing the retention member is Cycloy C 2800, which is a polycarbonate ABS blend plastic. Additionally, the retention member 100 may also be formed as a single structural element by utilizing an injection molding process.

Several variations on the disclosed embodiments are contemplated. As illustrated in FIG. 2, a second retention member 100 is utilized to secure retention module 190 to the motherboard. However, one or two retention members may be utilized when practicing the present invention.

Additionally, whereas three recesses were disclosed as being included in the side edge plates to accommodate hardware included on the underside of the motherboard, the recesses may be joined. A single, elongated recess that would extend from the first securement portion to the second securement portion of the retention member could be utilized. In this manner, a single recess could be formed in the side edge plates of the retention member that would be able to accommodate hardware included on the underside of the motherboard that would be positioned between the first and second securement portions of the retention member when the retention member was mounted onto the motherboard.

Whereas securement portions are disclosed as including a threaded insert within the bore that is defined therein, other than a threaded insert may be utilized. Alternatively, the securement portions may be manufactured by forming an internal thread within the bore. Thus, the threading would not be provided as a separate element that is retained within the bore, but rather, would be formed within the bore. It may be advantageous to utilize a metal threaded insert rather than forming an internal thread within the bore for ease of manufacturing purposes and for structural strength purposes, however, the present invention is not limited to only utilizing a threaded insert to achieve internal threading within the bores of the securement portions.

The disclosed embodiments are illustrative of the various ways in which the present invention may be practiced. Other embodiments can be implemented by those skilled in the art without departing from the spirit and scope of the present invention.

What is claimed is:

1. A retention member for securing a dual processor card retention module to a circuit board comprising:
    a base portion;
    a first securement portion disposed at a first end of said base portion and defining a first bore extending therethrough;
    a second securement portion disposed at a second end of said base portion and defining a second bore extending therethrough; and
    first and second attachment members, said first and second attachment members included on said base portion intermediate said first and second securement portions and extending vertically from said base portion;
    wherein said first and second attachment members each include:
        an elongated stem portion and a head portion, wherein said head portion extends perpendicularly from said elongated stem portion and wherein said head portion includes a camming surface on a topside thereof.

2. The retention member of claim 1 wherein said base portion defines a recess therein.

3. The retention member of claim 1 wherein said first and second securement portions are integrally formed with said first and second ends of said base portion, respectively.

4. The retention member of claim 1 wherein said first and second bores are internally threaded at least along a portion of said bores.

5. The retention member of claim 1 further comprising:
    a first threaded insert, said first threaded insert disposed within said first bore; and
    a second threaded insert, said second threaded insert disposed within said second bore.

6. The retention member of claim 5 wherein said first and second threaded inserts are integrally molded with said first and second securement portions, respectively.

7. A method for mounting a dual processor retention module to a circuit board comprising:
    positioning said dual processor retention module on a top side of said circuit board, said top side including a processor thereon;
    positioning a retention member on an underside of said circuit board; and
    connecting said dual processor retention module to said retention member with a connection member that extends through said retention member on said underside of said circuit board through said circuit board and into said dual processor retention module.

8. The method of claim 7 further comprising attaching said retention member onto said underside of said circuit board.

9. The method of claim 8 wherein attaching said retention member onto said underside of said circuit board comprises engaging said circuit board with first and second attachment members, said first and second attachment members included on said retention member.

10. The method of claim 9 further comprising aligning said dual processor retention module with said retention member by utilizing said first and second attachment members.

11. The method of claim 7 wherein positioning said retention member on said underside of said circuit board comprises positioning hardware included on said underside of said circuit board within a recess defined by said retention member.

12. An apparatus for securing a dual processor assembly to a circuit board comprising:
    a retention module, said retention module disposed on a top side of said circuit board, said top side including a processor thereon;
    a retention member, said retention member disposed on an underside of said circuit board; and
    a connection member, said connection member engaging said retention member on said underside of said circuit board, said connection member extending through said circuit board and engaging said retention module on said top side of said circuit board.

13. The apparatus of claim 12:
wherein said retention member includes:
- a base portion;
- a first securement portion disposed at a first end of said base portion and defining a first bore extending therethrough; and
- a second securement portion disposed at a second end of said base portion and defining a second bore extending therethrough;

wherein said retention module includes a base portion, said base portion defining first and second bores extending therethrough; and wherein said connection member is disposed through one of said first and second bores extending through said retention module and said circuit board and received within one of said first and second bores defined by said retention member.

14. The apparatus of claim 13 wherein said base portion of said retention member includes a bottom plate and first and second side edge plates, said first and second side edge plates extending perpendicular from said bottom plate.

15. The apparatus of claim 14 wherein each of said first and second side edge plates defines first and second recesses and wherein said first and second recesses are similarly formed.

* * * * *

UNITED STATES PATENT AND TRADEMARK OFFICE
CERTIFICATE OF CORRECTION

PATENT NO.   : 6,166,920
DATED        : December 26, 2000
INVENTOR(S)  : Michael R. Schweers; James D. Williams It is certified that error appears in the above-identified patent and that said Letters Patent is hereby corrected as shown below:

Column 3,
Line 31, "Te" should be -- the --

Signed and Sealed this

Twenty-sixth Day of February, 2002

Attest:

Attesting Officer

JAMES E. ROGAN
Director of the United States Patent and Trademark Office